United States Patent
Tanno et al.

(10) Patent No.: US 10,707,829 B2
(45) Date of Patent: Jul. 7, 2020

(54) LITHIUM TANTALATE SINGLE CRYSTAL SUBSTRATE FOR A SURFACE ACOUSTIC WAVE DEVICE AND A DEVICE USING THE SAME, AND A MANUFACTURING METHOD THEREOF AND AN INSPECTION METHOD THEREOF

(71) Applicant: SHIN-ETSU CHEMICAL CO., LTD., Tokyo (JP)

(72) Inventors: Masayuki Tanno, Annaka (JP); Jun Abe, Annaka (JP); Yoshinori Kuwabara, Annaka (JP); Junichi Kushibiki, Sendai (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 473 days.

(21) Appl. No.: 15/543,359

(22) PCT Filed: Dec. 16, 2015

(86) PCT No.: PCT/JP2015/085165
§ 371 (c)(1),
(2) Date: Jul. 13, 2017

(87) PCT Pub. No.: WO2016/114056
PCT Pub. Date: Jul. 21, 2016

(65) Prior Publication Data
US 2018/0006629 A1    Jan. 4, 2018

(30) Foreign Application Priority Data
Jan. 15, 2015  (JP) ................. 2015-005699

(51) Int. Cl.
*H03H 9/02*       (2006.01)
*H01L 41/18*      (2006.01)
(Continued)

(52) U.S. Cl.
CPC ....... *H03H 9/02559* (2013.01); *G01N 29/022* (2013.01); *G01N 29/043* (2013.01);
(Continued)

(58) Field of Classification Search
CPC .......... H01L 41/18; G01N 29/07; H03H 3/10; H03H 3/08
See application file for complete search history.

(56) References Cited

U.S. PATENT DOCUMENTS 6,652,644 B1    11/2003  Miller et al.
2017/0054068 A1*  2/2017  Masayuki ........... H01L 41/1873
(Continued)

FOREIGN PATENT DOCUMENTS

JP     6-164306 A    6/1994
JP    2003-207671 A  7/2003
(Continued)

OTHER PUBLICATIONS

Notification of Reasons for Refusal dated Sep. 19, 2017, issued in counterpart Japanese Application No. 2015-005699, with English machine translation. (6 pages).
(Continued)

*Primary Examiner* — J. San Martin
(74) *Attorney, Agent, or Firm* — Westerman, Hattori, Daniels & Adrian, LLP

(57) ABSTRACT

A lithium tantalate single crystal substrate for a surface acoustic wave device that is a rotated Y-cut LiTaO3 substrate whose crystal orientation has a Y-cut angle of not smaller than 36° and not larger than 49° and which has such a Li concentration profile after diffusion of Li into the substrate from the surface thereof that the Li concentration at the surface of the substrate differs from that inside the substrate. A shear vertical type elastic wave whose main components are vibrations in the thickness direction and in the propa-
(Continued)

Raman profile gation direction and which is among those elastic waves which propagate in the X axis direction within the surface of this LiTaO3 substrate has an acoustic velocity of not lower than 3140 m/s and not higher than 3200 m/s.

8 Claims, 3 Drawing Sheets

(51) Int. Cl.
  $H03H\ 3/08$ (2006.01)
  $G01N\ 29/22$ (2006.01)
  $G01N\ 29/24$ (2006.01)
  $G01N\ 29/02$ (2006.01)
  $H03H\ 9/25$ (2006.01)
  $G01N\ 29/04$ (2006.01)
  $G01N\ 29/07$ (2006.01)
  $H03H\ 3/10$ (2006.01)
(52) U.S. Cl.
  CPC ............ G01N 29/07 (2013.01); G01N 29/22 (2013.01); G01N 29/2462 (2013.01); H01L 41/18 (2013.01); H03H 3/08 (2013.01); H03H 3/10 (2013.01); H03H 9/02834 (2013.01); H03H 9/02897 (2013.01); H03H 9/25 (2013.01); *G01N 2291/0422* (2013.01)

(56) References Cited

U.S. PATENT DOCUMENTS

2018/0048283 A1*  2/2018  Tanno ................ H01L 41/18
2018/0080144 A1*  3/2018  Tanno ................ C04B 37/00

FOREIGN PATENT DOCUMENTS

| JP | 2011-135245 A | 7/2011 |
| JP | 2013-66032 A | 4/2013 |
| JP | 2013-236276 A | 11/2013 |
| JP | 2014-154911 A | 8/2014 |
| WO | 2013/135886 A1 | 9/2013 |

OTHER PUBLICATIONS

International Search Report dated Mar. 1, 2016, issued in counterpart application No. PCT/JP2015/085165. (2 pages).

Bartasyte et al., "Reduction of Temperature Coefficient of Frequency in LiTaO$_3$ Single Crystals for Surface Acoustic Wave Applications" Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl Symp, IEEE, 2012, pp. 1-3 (3 pages).

Kushibiki et al., "Standardized Evaluation of Chemical Compositions of LiTaO$_3$ Single Crystals for SAW Devices Using the LFB Ultrasonic Material Characterization System", IEEE Transactions on Ultrasonics, Ferroelectrics, and Frequency Control, Apr. 2002, vol. 49, No. 4, pp. 454-465 (12 pages).

* cited by examiner

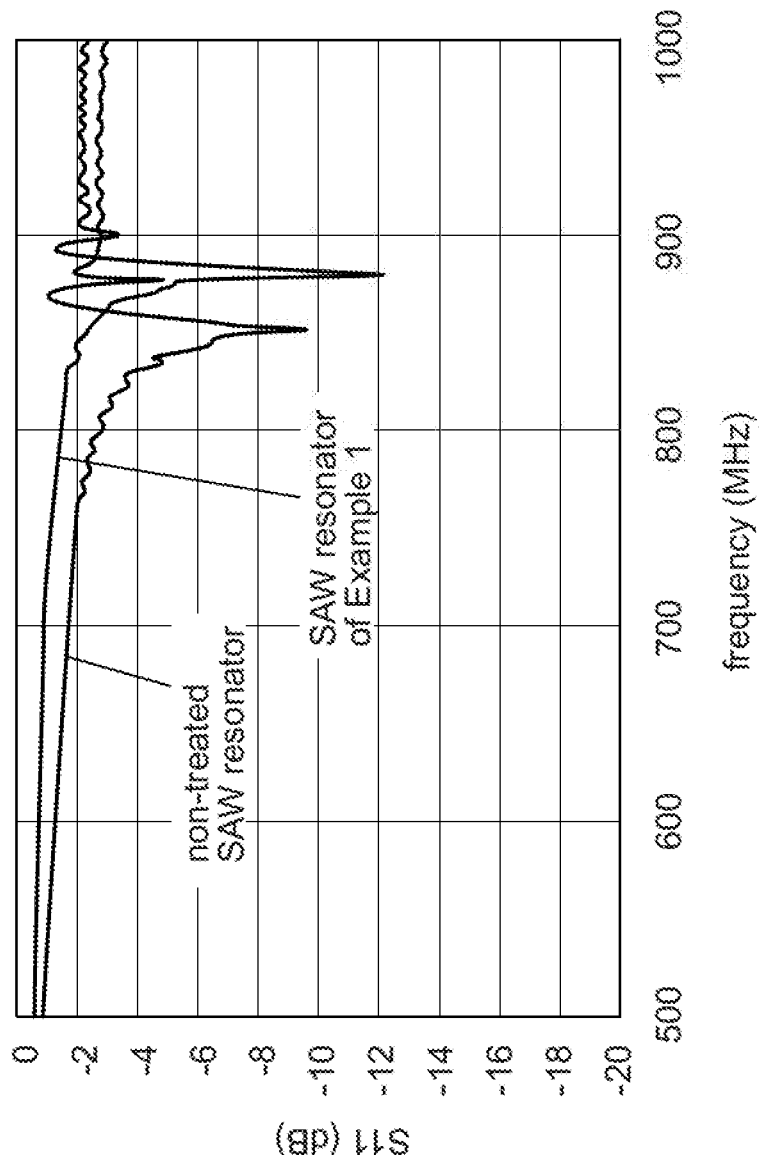

1

LITHIUM TANTALATE SINGLE CRYSTAL SUBSTRATE FOR A SURFACE ACOUSTIC WAVE DEVICE AND A DEVICE USING THE SAME, AND A MANUFACTURING METHOD THEREOF AND AN INSPECTION METHOD THEREOF

TECHNICAL FIELD

The present invention relates to a lithium tantalate single crystal substrate for a surface acoustic wave device and a device using the same, and a manufacturing method thereof and an inspection method thereof.

BACKGROUND ART

A SAW (Surface Acoustic Wave) device having a comb-like electrode for exciting a surface acoustic wave on a piezoelectric substrate, for example, is used as a component for frequency adjustment and selection of a mobile phone. For this surface acoustic wave device, a piezoelectric material such as lithium tantalate, $LiTaO_3$ (hereinafter also referred to as "LT"), and lithium niobate, $LiNbO_3$ (hereinafter also referred to as "LN"), is used to make it, because piezoelectric materials meet the requirements of smallness in size, small insertion loss, and ability to stop passage of unnecessary waves. In particular, the communication standards of cellular phones of the fourth generation often have a narrow differential in frequency band between transmission and reception, and a wide bandwidth. Furthermore, since the properties of the material of a surface acoustic wave device undergo changes with temperature, causing a shift in the frequency selection range, there occur problems in the functions of the filter and duplexer. Therefore, a material for a surface acoustic wave device, which has small tendency to undergo fluctuation in characteristics with respect to temperature change, and has a wide band, or is stable against a narrow temperature fluctuation, is desired.

Regarding the material for the surface acoustic wave device, for example, IP Document 1 teaches that a stoichiometric composition LT composed of copper used as an electrode material and mainly obtained by a gas phase method is preferable because the breakdown mode which is destroyed at the moment when high power is input to the IDT electrode is difficult to occur. IP Document 2 has a detailed description on the stoichiometry composition LT obtained by the gas phase method; and IP Document 3 describes a method of forming a waveguide for annealing a waveguide formed in a ferroelectric crystal of lithium tantalate or lithium niobate; and IP Document 4 describes a piezoelectric substrate for a surface acoustic wave device obtained by subjecting a lithium tantalate or lithium niobate single crystal substrate to Li diffusion treatment. IP Document 5 and Non-IP Document 1 also report that when LT in which the LT composition is uniformly transformed to Li-rich in the thickness direction by the gas phase equilibrium method is used to make the surface acoustic wave element, its frequency temperature characteristic is improved, which is preferable.

However, the inventors of the present invention have examined the methods described in these publications, and as a result, it has been found that these methods do not necessarily provide favorable results. In particular, according to the method described in IP Document 5, since the wafer is processed over a long period of time of 60 hours at a high temperature of about 1300° C. in the vapor phase, the manufacturing temperature has to be high, the consequent warpage of the wafer is large, and cracks occur at high rate, whereby the productivity becomes poor, and there is also a problem that the product becomes too expensive as a material for a surface acoustic wave device. Moreover, the degrees of variation in characteristics become large on account of the facts that the vapor pressure of $Li_2O$ is low and the modification degree of the sample to be modified varies depending on the distance from the Li source, and hence a considerable improvement is required for industrialization, and this problem has not been solved yet.

Also, with respect to a rotated Y-cut lithium tantalate single crystal substrate for SAW device, in order to apply this to a mass production process, it is necessary to adjust the sound speed of the shear horizontal type (SH) wave used in the device to be within a desired range. Therefore, Non-IP Document 2 describes means to adjust the acoustic (sound) velocity of the SH wave to be within a certain range, such as a method of adjusting the acoustic velocity of the SH wave by restricting the Curie temperature of the lithium tantalate single crystal substrate within a certain range to thereby adjusting the acoustic velocity of the SH wave, making use of the fact that the said Curie temperature and the acoustic velocity of the SH wave correlate with each other; a method of adjusting the acoustic velocity of the SH wave by restricting the lattice constant of the lithium tantalate single crystal substrate within a certain range thereby adjusting the acoustic velocity of the SH wave, making use of the fact that the said lattice constant and the acoustic velocity of SH wave correlate with each other; and a method of adjusting the acoustic velocity of SH wave by restricting the acoustic velocity of the shear vertical type acoustic wave of the lithium tantalate single crystal substrate within a certain range to thereby adjusting the acoustic velocity of the SH wave, making use of the fact that the said acoustic velocity of the shear vertical type acoustic wave and the acoustic velocity correlate with each other.

However, in the case of a rotated Y-cut lithium tantalate single crystal substrate having such a Li concentration profile in which the Li concentration differs between the substrate surface area and the inside of the substrate on account of the fact that Li was diffused into the $LiTaO_3$ substrate from the surface to the inside thereof, since a Li concentration distribution occurs in the depth direction, the Curie temperature and the lattice constant also fluctuate in the depth direction due to the said Li concentration distribution, there is consequently a problem that it is difficult to use the Curie temperature and the lattice constant as the indices for adjusting the sound speed of the shear horizontal type (SH) wave to be within a desired range. Furthermore, the relationship between the lithium tantalate single crystal substrate having the Li concentration profile of varying values between the substrate surface and the inside of the substrate and the acoustic velocity of the shear vertical type (SV) acoustic wave is not well known yet.

PRIOR ART DOCUMENTS

Non-IP Publications

Non-IP Publication 1:
Bartasyte, A. et. al, "Reduction of temperature coefficient of frequency in $LiTaO_3$ single crystals for surface acoustic wave applications" Applications of Ferroelectrics held jointly with 2012 European Conference on the Applications of Polar Dielectrics and 2012 International Symp Piezoresponse Force Microscopy and Nanoscale Phenomena in Polar Materials (ISAF/ECAPD/PFM), 2012 Intl Symp, 2012, Page(s): 1-3

Non-IP Publication 2:

Jun-ichi Kushibiki, Yuji Ohashi, and Takaaki Ujiie, "Standardized Evaluation of Chemical Compositions of LiTaO$_3$ Single Crystals for SAW Devices Using the LFB Ultrasonic Material Characterization System" IEEE TRANSACTIONS ON ULTRASONICS, FERROELECTRICS, AND FREQUENCY CONTROL; VOL. 49, NO. 4. APRIL 2002, pp. 454-465

IP Publications

IP Publication 1: Japanese Patent Application Publication No. 2011-135245
IP Publication 2: U.S. Pat. No. 6,652,644 (B1)
IP Publication 3: Japanese Patent Application Publication No. 2003-207671
IP Publication 4: Japanese Patent Application Publication No. 2013-66032
IP Publication 5: WO2013/135886(A1)

SUMMARY OF THE INVENTION

Problems to be Solved by Invention

The present invention has been made in view of the above circumstances, and it is an object of the present invention to provide such a lithium tantalate single crystal substrate for a surface acoustic wave device that is small in warpage, free from cracks and scratches, has a temperature characteristic smaller than that of a conventional rotated Y-cut LiTaO$_3$ substrate, and is capable of having its electromechanical coupling factor appropriately adjusted to correspond with the band of a mobile; it is also an object of the invention to provide a device to use this substrate and also to provide a manufacturing method and inspection method for the same substrate.

In order to achieve the above object, the inventors of the present invention focused their study on the yet unknown relationship between the lithium tantalate single crystal substrate having a Li concentration profile with differing Li concentrations and the acoustic velocity of the shear vertical type acoustic wave; as a result, they came to find out that if, out of many acoustic waves which propagate in X-axis direction in the surface of a rotated Y-cut LiTaO$_3$ substrate which has been modified by a vapor phase treatment wherein Li is diffused in the substrate with roughly congruent composition, (if) those shear vertical type acoustic waves (SV wave or leaky wave) whose main components are vibrations in the thickness direction and in the propagation direction are set to have an acoustic velocity of from 3140 m/s through 3200 m/s, then it is possible to obtain a lithium tantalate single crystal substrate for a surface acoustic wave device whose characteristics are more stable against temperature changes than in the case of a conventional rotated Y-cut LiTaO$_3$ substrate and which is capable of having its electromechanical coupling coefficient adjusted, as necessary, to correspond with the band of a mobile phone, and hence the inventors came to possess this invention.

Means for Solving the Problem

The lithium tantalate single crystal substrate of the present invention is a rotated Y-cut LiTaO$_3$ substrate whose crystal orientation is rotated from 36° Y through 49° Y cut and which has a Li concentration profile, obtained by diffusing Li into the substrate from the surface thereof, characterized by that the Li concentration at the surface of the substrate differs from that inside the substrate, and this inventive substrate is further characterized by that among those elastic waves which propagate in the X axis direction within the surface of this LiTaO$_3$ substrate, a shear vertical type acoustic wave whose main components are vibrations in the thickness direction and in the propagation direction has an acoustic velocity of from 3140 m/s through 3200 m/s, and preferably from 3160 m/s through 3170 m/s.

The manufacturing method of the present invention is characteristic in that the LiTaO$_3$ substrate which has been subjected to a Li diffusion treatment is subjected to an annealing treatment in the temperature range of 800-1000° C. whereby, out of those acoustic waves which propagate in X-axis direction, the shear vertical type acoustic wave whose main components are vibration in the thickness direction and in the propagation direction is adjusted to a range of from 3140 m/s through 3200 m/s, or preferably from 3160 m/s through 3170 m/s.

Furthermore, the inspection method of the present invention is characteristic in that, out of the acoustic waves which propagate in the X-axis direction in the surface of the rotated Y-cut LiTaO$_3$ substrate, the shear vertical type acoustic wave whose main component is the vibration in the thickness direction and in the propagation direction is measured for its acoustic velocity, and that the resulting value is used to estimate whether or not the substrate can be used as a surface acoustic wave device.

Effects of the Invention

According to the present invention, it is possible to provide a lithium tantalate single crystal substrate for a surface acoustic wave device whose properties are more stable against temperature changes than in the case of conventional rotated Y-cut LiTaO$_3$ substrate and which is capable of having its electromechanical coupling coefficient appropriately adjusted to correspond with the band of a mobile phone, and also it is possible to provide a SAW device including such substrate at low cost. In particular, a SAW device in which the acoustic velocity of the shear vertical type elastic wave is from 3160 m/s through 3170 m/s has a greater band width than a normal LT, and is therefore suitable for a broad band required for a smartphone.

BRIEF DESCRIPTION OF THE DRAWINGS

FIG. 3 is a schematic diagram showing SAW resonator waveforms of Example 1.

EMBODIMENTS FOR CARRYING OUT THE INVENTION

Hereinafter, an embodiment of the present invention will be described in detail, with reference to examples and comparative examples.

EXAMPLES

Example 1

In Example 1, first, a singly polarized 4-inch diameter lithium tantalate single crystal ingot having a roughly congruent composition and having a Li:Ta ratio of 48.5:51.5 was sliced to obtain a number of 300-μm-thick 42° rotated Y-cut lithium tantalate substrates. Thereafter, in view of a circumstance, the surface roughness of each sliced wafer was adjusted to 0.15 μm in arithmetic average roughness Ra value by a lapping procedure, and the finished thickness was set to 250 μm.

After one side surface of the resulting substrate was finished into a quasi-mirror surface having a Ra value of 0.01 μm by planar polishing, the substrate was buried in a powder containing Li, Ta and O with $Li_3TaO_4$ as a main component. In this example, the powder in which $Li_3TaO_4$ was a main component was prepared by mixing $Li_2CO_3$ powder and $TaO_5$ powder at a molar ratio of 7:3, followed by baking at 1300° C. for 12 hours. Then, this powder containing $Li_3TaO_4$ as a main component was laid in a small container, and a plurality of said sliced wafer were buried in this mostly $Li_3TaO_4$ powder.

Then, this small container was set in an electric furnace, which was subsequently filled with an $N_2$ atmosphere and heated at 950° C. for 60 hours, to thereby cause Li to diffuse into the sliced wafer from the surface toward the middle thereof. Thereafter, the thus treated slice substrate was subjected to an anneal treatment in an $N_2$ atmosphere at 800° C., which is higher than the Curie temperature, for 12 hours, and when the wafer was allowed to cool, an electric field of 2000 V/m was applied in roughly +Z axis direction during the period when the temperature was between 770° C. and 500°, and thereafter the temperature was caused to fall to the room temperature. Also after this treatment, the rough side face of the wafer was subjected to a sandblasting to finish it to an Ra value of about 0.15 μm, and the quasi-mirror side face thereof was polished 3 μm deep and thus a plurality of lithium tantalate single crystal substrates were obtained.

Figure 1:
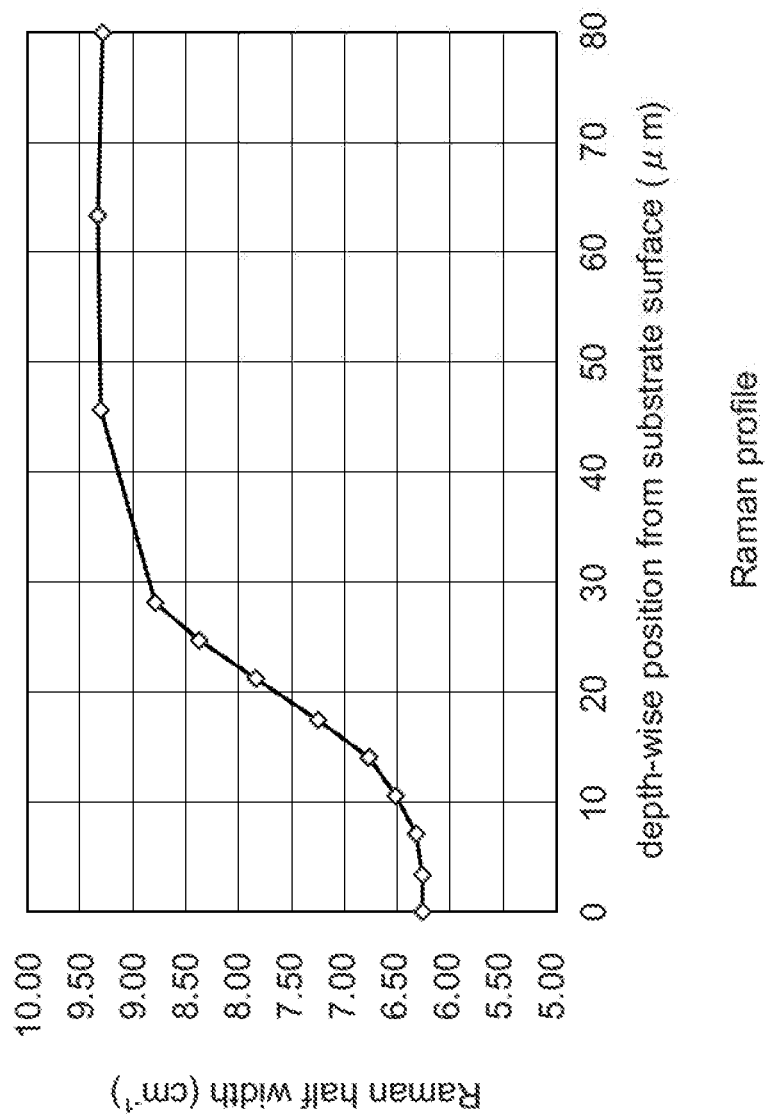
FIG. 1 is a schematic diagram showing a Raman profile.

With respect of one of these lithium tantalate single crystal substrates, a laser Raman spectrometer (LabRam HR series manufactured by HORIBA Scientific Inc., Ar ion laser, spot size 1 μm, room temperature) was used to measure the half-value width of the Raman shift peak around 600 $cm^{-1}$, which is an indicator of the Li diffusion amount, through a depth-wise distance from the surface at an arbitrarily chosen site which was 1 cm or more away from the outer circumference of the circular substrate; and as the result a Raman profile as shown in FIG. 1 was obtained.

According to the result in FIG. 1, in this lithium tantalate single crystal substrate, the value of the Raman half width (half-value width) measured at the surface was found different from that measured inside the substrate, and, in particular, there exists a range, namely, the range between the depths of about 0 μm and about 80 μm where the Raman half-value width value decreases as the measurement approaches the surface of the substrate and the Raman half-value width value increases as the measurement approaches the middle of the substrate.

Also, the Raman half-value width at the surface of the lithium tantalate single crystal substrate was 6.3 $cm^{-1}$, and the Raman half-width at the middle portion in the thickness direction of the substrate was 9.3 $cm^{-1}$. Incidentally, according to the result of FIG. 1, the Li concentration is seen to pick up from the depth of 40 μm from the surface and increases as the depth decreases, so that in Example 1 the position where the depth from the surface is 80 μm is considered the middle part of the substrate in thickness direction. Hence, the difference between the Raman half-value width at the substrate surface and the Raman half-value width at the middle part of the substrate in thickness direction was 3.0 $cm^{-1}$.

From the result of FIG. 1, it was confirmed that the lithium tantalate single crystal substrate of Example 1 has a Li concentration profile wherein the Li concentration at the surface differs from that inside the substrate, and in particular there exists a range, namely, the range between the depths of about 0 μm and about 80 μm where the Li concentration increases as the measurement approaches the surface of the substrate and the Li concentration decreases as the measurement approaches the middle portion of the substrate. Incidentally it would have been preferable if this characteristic range of the concentration profile had extended to a depth of about 100 μm from the surface of the substrate.

Also, since FIG. 1 shows that the Raman half-value width of the lithium tantalate single crystal substrate was about 6.3 $cm^{-1}$ in the range between the surface and the depth of 8 μm, it follows that, from the Equation (1) below, the composition in that range becomes roughly Li/(Li+Ta)=0.50, and hence it was confirmed that pseudo-stoichiometry composition had been established there.

$$Li/(Li+Ta)=(53.15-0.5FWHM1)/100 \quad (1)$$

Furthermore, since the Raman half-value width of the lithium tantalate single crystal substrate at its middle part in thickness direction was about 9.3 $cm^{-1}$, if follows from Equation (1) that the value of Li/(Li+Ta) becomes 0.485 so that it was confirmed that a roughly congruent composition had occurred there.

Hence, in the case of the rotated Y-cut $LiTaO_3$ substrate of Example 1, a pseudo-stoichiometry composition was established in the range between the substrate surface and a depth at which the Li concentration starts decreasing or the range between the substrate surface and a depth at which the Li concentration stops increasing, and a roughly congruent composition occurred at the middle position of the substrate in the thickness direction. And it is preferable that the position at which the Li concentration starts increasing or at which the Li concentration stops decreasing is deeper than a depth of 5-10 μm from the substrate surface in the thickness direction.

Next, the warping of the 4-inch lithium tantalate single crystal substrate after being subjected to the Li diffusion was measured by an interference method using a laser beam, and the value obtained was as small as 80 μm, and cracks and chipping were not observed Then, a small piece was cut out from the thus obtained Li-diffused 4-inch 42° rotated Y cut lithium tantalate single crystal substrate, and, in a Piezo d33/d15 meter (model ZJ-3BN) manufactured by The Institute of Acoustics of the Chinese Academy of Sciences, the small piece was given a vertical vibration in the thickness direction to the principal face and also to the back face respectively to observe the voltage waveform thereby induced, and a waveform was observed which indicated a presence of piezoelectric response.

Hence it was confirmed that the lithium tantalate single crystal substrate of Example 1 has piezoelectricity, and thus can be used as a surface acoustic wave device.

Next, among the elastic waves that propagate in the X-axis direction on the polished surface of the 4-inch 42° Y-cut lithium tantalate single crystal substrate, which had gone through the Li diffusion treatment, the annealing treatment and the polishing treatment, those shear vertical type elastic wave (SV wave or leaky wave) whose main components are a vibration in the thickness direction and that in the propagation direction was measured for its acoustic velocity by the ultrasonic microscope described in the above Non-IP Publication 2, and the acoustic velocity of the SV wave was found to be 3166.9 (m/s) at a temperature of 23.0° C.

Incidentally, in Example 1, although the acoustic velocity of the shear vertical type elastic wave was measured with respect to the X axis direction, it is possible to adjust the acoustic velocity of a shear vertical type elastic wave that propagates in any of the in-plane directions of the substrate surface. For example, an LiTaO$_3$ substrate subjected to the Li diffusion treatment may be annealed in a temperature range of 800 to 1000° C., and the acoustic velocity of the elastic waves of the shear vertical type whose main components are the vibrations in the thickness direction and the propagation direction among those elastic waves which propagate in the direction perpendicular to the X axis within the plane of this substrate may be adjusted to a range of from 3170 m/s through 3250 m/s, or preferably from 3195 m/s through 3205 m/s.

For comparison, the acoustic velocity of those shear vertical type elastic waves (SV wave or leaky wave) whose main components were vibrations in the thickness direction and the propagation direction among all the elastic waves which propagate in the X-axis direction of the polished surface of the 42° Y-cut lithium tantalate single crystal substrate not subjected to the Li diffusion treatment, was measured and found to be 3126.5 (m/s) at a temperature of 23.0° C. The acoustic velocity of the SV wave in the direction perpendicular to the X axis within the same plane was 3161.0 (m/s) at a temperature of 23.0° C.

Next, a sputtering treatment was performed on the 42° Y-cut lithium tantalate single crystal substrate after having been subjected to the Li diffusion treatment in Example 1, to form an Al film having a thickness of 0.2 μm thereon; thereafter, a resist was applied to the substrate to which the Al film had been formed, and an electrode pattern of a single-stage ladder type filter was exposed and developed with a stepper, and an electrode for SAW characteristic evaluation was provided by RIE. Incidentally, one wavelength of the thus patterned SAW electrode was set to 2.33 μm in the case of the series resonator and that in the case of the parallel resonator was set to 2.42 μm.

Figure 2:
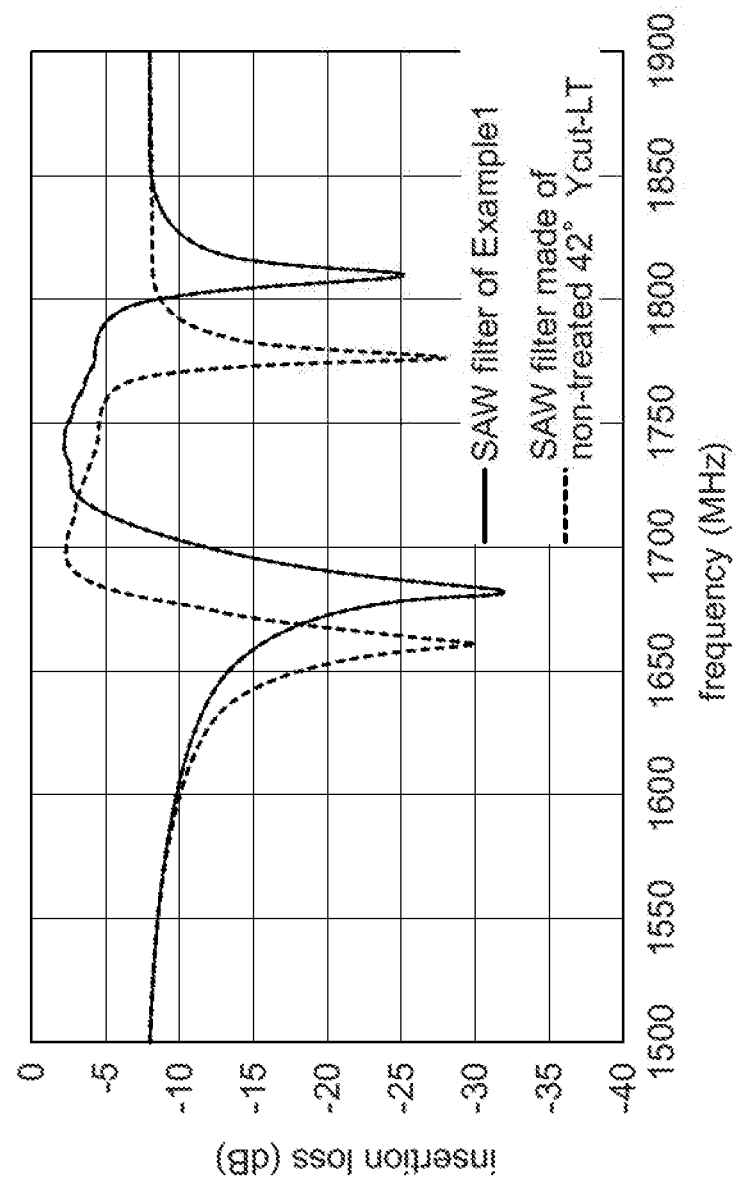
FIG. 2 is a schematic diagram showing insertion loss waveforms of the SAW filter of Example 1.

With respect to this one-stage ladder type filter, its SAW waveform characteristic was explored by an RF prober, and the result shown in FIG. 2 was obtained. In FIG. 2, for comparison, the same pattern as described above was formed on a 42° Y-cut lithium tantalate single crystal substrate not having been subjected to Li diffusion treatment, and the result of measurement of the SAW waveform is also shown in FIG. 2.

From the results in FIG. 2, the frequency width at which the insertion loss of the SAW filter made of a 42° Y-cut lithium tantalate single crystal substrate subjected to Li diffusion treatment becomes 3 dB or less is 37 MHz, and the center frequency of the filter was confirmed to be 1745 MHz.

Further, when the temperature coefficients of the anti-resonance frequency and the resonance frequency were inspected by varying the stage temperature from about 16° C. to 70° C., the temperature coefficient of the resonance frequency was −20.3 ppm/° C. and the temperature coefficient of the anti-resonance frequency was −41.7 ppm/° C., and thus it was confirmed that the average temperature coefficient of the frequency was −31 ppm/° C.

For comparison, when the temperature coefficient of the 42° Y-cut lithium tantalate single crystal substrate having not been subjected to the Li diffusion treatment was inspected, the temperature coefficient of the resonance frequency was −32 ppm/° C. and the temperature coefficient of the anti-resonance frequency was −42 ppm/° C., so that it was confirmed that the average frequency temperature coefficient was −37 ppm/° C.

Therefore, it was confirmed that, in the lithium tantalate single crystal substrate of Example 1, the band where the insertion loss of the filter is 3 dB or less is 1.3 times wider than that of the substrate without Li diffusion treatment, and that even when the same electrode was used, the center frequency became 1.03 times higher, indicating a phenomenon of frequency increase. Also regarding the temperature characteristics, the average frequency temperature coefficient of the substrate with Li diffusion treatment was 6.0 ppm/° C. lower than that of the substrate without the Li diffusion treatment, and hence the former substrate showed smaller property change with temperature so that the former is superior to the latter in temperature characteristic.

Next, in addition to providing the SAW electrode to the 42° C. Y-cut lithium tantalate single crystal substrate with the Li diffusion treatment obtained in Example 1, a 1-port SAW resonator with a wavelength of 4.8 μm was also provided to the substrate in the similar manner as described above, and a SAW waveform shown in FIG. 3 was obtained. For comparison, the same pattern as described above was formed on a 42° Y-cut lithium tantalate single crystal substrate not subjected to Li diffusion treatment, and the result of the measurement of the SAW waveform therewith is also shown in FIG. 3.

Then, on one hand, from the result of the SAW waveforms of FIG. 3 the values of the anti-resonance frequency and the resonance frequency were obtained and the difference therebetween was obtained, and on the other hand, the same procedure was taken to obtain the said difference in the case of the 42° Y-cut lithium tantalate single crystal substrate not subjected to the Li diffusion treatment, and the ratio between these differences was calculated.

This ratio represents a relative electromechanical coupling coefficient of the 42° Y-cut lithium tantalate single crystal substrate subjected to the Li diffusion treatment of Example 1, when the electromechanical coupling coefficient of the 42° Y-cut lithium tantalate single crystal substrate not subjected to the Li diffusion treatment is deemed to be 1. In Example 1, it was confirmed that the relative electromechanical coupling coefficient was 1.3. Also, the SAW acoustic velocities of the shear horizontal type as obtained by dividing the values of the anti-resonant frequency and the resonance frequency by the wavelength were averaged and the results are shown in Table 1.

Example 2

In Example 2, first, a singly polarized 4-inch diameter lithium tantalate single crystal ingot having a roughly congruent composition and having a Li:Ta ratio of 48.5:51.5 was sliced to obtain a number of 42° rotated Y-cut lithium tantalate. Thereafter, in view of a circumstance, the surface roughness of each sliced wafer was adjusted to 0.15 μm in arithmetic average roughness Ra value by a lapping procedure, and the finished thickness was set to 250 μm.

Also, after one side surface of the resulting substrate was finished into a quasi-mirror surface having a Ra value of 0.01 μm by planar polishing, the substrate was buried in a powder containing Li, Ta and O with Li$_3$TaO$_4$ as a main component. In this example, the powder in which Li$_3$TaO$_4$ was a main component was prepared by mixing Li$_2$CO$_3$ powder and TaO$_5$ powder at a molar ratio of 7:3, followed by baking at 1300° C. for 12 hours. Then, this powder containing $Li_3TaO_4$ as a main component was laid in a small container, and a plurality of the said sliced wafer were buried in this mostly $Li_3TaO_4$ powder.

Then, this small container was set in an electric furnace, which was subsequently filled with an $N_2$ atmosphere and heated at 950° C. for 60 hours to thereby cause Li to diffuse into the sliced wafer from the surface toward the middle thereof. Thereafter, the thus treated slice substrate was subjected to an anneal treatment in an $N_2$ atmosphere at 800° C., which is higher than the Curie temperature, for 12 hours, and the temperature was caused to fall to the room temperature. Also after this treatment, the rough side face of the wafer was subjected to a sandblasting to finish it to an Ra value of about 0.15 μm, and the quasi-mirror side face of the wafer was polished 3 μm deep and thus a plurality of lithium tantalate single crystal substrates were obtained.

In this Example 2, with respect to five samples consisting of 42° Y-cut lithium tantalate single crystal substrates to which annealing treatment of 800° C.-1000° C. had been applied, the Raman half-value width at the surface, the Raman half-value width at the middle portion in the substrate thickness direction, the relative electromechanical coupling coefficient, the average frequency temperature coefficient, the SV wave acoustic velocity at a temperature of 23° C. of shear vertical type elastic wave whose main components are vibrations in the thickness direction and the propagation direction out of the elastic waves that propagate in the X-axis direction, the SV wave acoustic velocities in the X-axis direction and in the direction vertical to the X-axis at a temperature of 23° C., and the SH wave average acoustic velocity were obtained in the similar manners as describe in Example 1, and the results were as shown in Table 1.

In Table 1, the results obtained with a 42° Y-cut lithium tantalate single crystal substrate not subjected to the Li diffusion treatment as well as the results of Example 1 are shown together for comparison.

coefficient was smaller than that of the conventional sample which had not been subjected to the annealing treatment.

Example 3

In Example 3, using 38.5° Y-cut lithium tantalate single crystal substrates the same experiments were conducted as in Example 1 and Example 2, and it was confirmed that the resulting properties obtained in Example 3 were similar to those listed in Table 1.

Example 4

In Example 4, ten batches of the same material as in Example 1 were produced as once, and the same Li diffusion treatment and annealing treatment were applied to the 10 batches of the material as in Example 1, and, after conducting the polishing treatment, with respect to each 4-inch 42° Y-cut lithium tantalate single crystal substrate, among the elastic waves that propagate in X-axis direction within the polished surface those shear vertical type elastic waves (SV wave or leaky wave) whose main components were vibrations in the thickness direction and propagation direction were measured for their acoustic velocity using the same ultrasonic microscope as used in Example 1, and as the result it was confirmed that the SV wave acoustic velocities thus obtained in all of the ten cases were in the range of 3166±1 (m/s) at a temperature of 23.0° C. With respect to these wafers, the average SAW acoustic velocity of the shear horizontal type was determined in the same manner as in Example 1, and the resultant values were within a range of 4249±1.5 m/s at 23.0° C.

As is clear from the results of the Examples, if a $LiTaO_3$ substrate having a roughly congruent composition is subjected to such a Li diffusion whereby Li is diffused into the substrate from the surface thereof with a result that a concentration profile is established such that the Li concentration differs between the surface and the inside of the

TABLE 1

Annealing temperature and various characteristics

| | SV wave acoustic velocity in X-axis direction at 23° C. (m/s) | SV wave acoustic velocity in direction vertical to X-axis within water surface at 23° C. (m/s) | annealing temperature (° C.) | Raman half-value width within surface ($cm^{-1}$) | Raman half-value width at thickness-wise middle part of substrate ($cm^{-1}$) | relative electro-mechanical coupling coefficient | average frequency temperature coefficient (ppm/° C.) | SH wave average acoustic velocity (m/s) |
|---|---|---|---|---|---|---|---|---|
| Example 1 | 3166.9 | 3201.2 | 800 | 6.3 | 9.3 | 1.3 | −31 | 4250 |
| Example 2-1 | 3163.5 | 3197.6 | 800 | 6.4 | 9.3 | 1.3 | −32 | 4240 |
| Example 2-2 | 3159.0 | 3186.4 | 825 | 6.9 | 9.3 | 1.01 | −27 | 4195 |
| Example 2-3 | 3156.3 | 3192.1 | 900 | 7.1 | 9.3 | 0.8 | −18 | 4080 |
| Example 2-4 | 3155.4 | 3190.2 | 950 | 7.5 | 9.3 | 0.6 | −19 | 4062 |
| Example 2-5 | 3140.3 | 3173.7 | 1000 | 7.5 | 9.3 | 0.4 | −16 | 4040 |
| no treatment; 42° Ycut-LT | 3126.5 | 3161.0 | — | 9.3 | 9.3 | 1 | −37 | 4120 |

From the results shown in Table 1, it is confirmed that in all of the five samples which were subjected to annealing treatment at a temperature between 800° C. and 1000° C., the SV wave acoustic velocity in X-axis direction at 23° C. turned out to be 3140 m/s or higher, and that the absolute value of their respective average frequency temperature substrate, and if the thus modified lithium tantalate single crystal substrate with 36° Y-cut through 49° Y-cut is adjusted by such an annealing treatment that the resultant acoustic velocity of the shear vertical type elastic wave (SV wave or leaky wave) whose main components are the vibrations in the thickness direction and propagation direction out of those elastic waves that propagate in X-axis direction within the substrate surface becomes from 3140 m/s through 3200 m/s, then a lithium tatalate single crystal substrate for surface acoustic wave device is obtained whose temperature characteristic is smaller than that of the conventional rotated Y-cut LiTaO$_3$ substrate and, furthermore, which is capable of adjusting its electromechanical coupling coefficient to meet mobile phone band appropriately; and also it is possible to obtain a SAW device wherein such a substrate as described above is used.

In particular, if the acoustic velocity of the SV wave is adjusted to be not less than 3160 m/s and not more than 3170 m/s, it is possible to obtain a lithium tantalate single crystal substrate with such a broadband that is required for a smartphone and with a temperature characteristic which is smaller than that of the conventional rotated Y-cut LiTaO$_3$ substrate, and further a SAW device using this substrate can be obtained at a low cost.

Moreover, because the SAW acoustic velocity of the shear vertical type (SV wave) can be measured without configuring a device, it is possible to non-destructively predict the SAW acoustic velocity of the shear horizontal type required for a SAW device; consequently it is possible to provide, at low cost, a material with low tendency of undergoing property changes with temperature changes.

Scopes of what is claimed:

1. A lithium tantalate single crystal substrate for a surface acoustic wave device, comprising a rotated Y-cut LiTaO$_3$ substrate, wherein:
   a crystal orientation of the LiTaO$_3$ substrate has a Y-cut angle of not smaller than 36° and not larger than 49°,
   the LiTaO$_3$ substrate has such a Li concentration profile after diffusion of Li into the LiTaO$_3$ substrate from a surface thereof that the Li concentration at the surface of the LiTaO$_3$ substrate differs from the Li concentration inside the LiTaO$_3$ substrate,
   among elastic waves which propagate in an X-axis direction within the surface of the LiTaO$_3$ substrate, a shear vertical type elastic wave whose main components are vibrations in a thickness direction and in a propagation direction has an acoustic velocity of not lower than 3140 m/s and not higher than 3200 m/s, and
   wherein an average frequency temperature coefficient of the lithium tantalate single crystal substrate is from −32 ppm/° C. to −16 ppm/° C.

2. The lithium tantalite single crystal substrate as claimed in claim 1, wherein said Li concentration profile is such that the Li concentration is higher in areas closer to the surface of the LiTaO$_3$ substrate and the Li concentration is lower in areas closer to a middle of the LiTaO$_3$ substrate.

3. The lithium tantalate single crystal substrate as claimed in claim 1, wherein the acoustic velocity of said shear vertical type elastic wave is not lower than 3160 m/s and not higher than 3170 m/s.

4. A surface acoustic wave device, comprising the lithium tantalate single crystal substrate as claimed in claim 1.

5. A method for manufacturing a lithium tantalate single crystal substrate that is a rotated Y-cut LiTaO$_3$ substrate whose crystal orientation has a Y-cut angle of not smaller than 36° and not larger than 49° and which has such a Li concentration profile after diffusion of Li into the LiTaO$_3$ substrate from a surface thereof that the Li concentration at the surface of the LiTaO$_3$ substrate differs from that inside the LiTaO$_3$ substrate, the method comprising:
   applying an annealing treatment at 800-1000° C. to the LiTaO$_3$ substrate after said Li diffusion treatment to thereby adjust a shear vertical type elastic wave whose main components are vibrations in the thickness direction and in the propagation direction and which is among those elastic waves which propagate in an X axis direction in a manner such that said shear vertical type elastic wave has an acoustic velocity of not lower than 3140 m/s and not higher than 3200 m/s.

6. The method for manufacturing a lithium tantalate single crystal substrate as claimed in claim 5, the acoustic velocity of the shear vertical type elastic wave is not lower than 3160 m/s and not higher than 3170 m/s.

7. A method for inspecting a lithium tantalate single crystal substrate that is a rotated Y-cut LiTaO$_3$ substrate whose crystal orientation has a Y-cut angle of not smaller than 36° and not larger than 49° and which has such a Li concentration profile after diffusion of Li into the LiTaO$_3$ substrate from a surface thereof that the Li concentration at the surface of the LiTaO$_3$ substrate differs from that inside the LiTaO$_3$ substrate, the method comprising:
   measuring an acoustic velocity of a shear vertical type elastic wave whose main components are vibrations in the thickness direction and in the propagation direction and which is among those elastic waves that propagate in an X axis direction within the surface of said rotated Y-cut LiTaO$_3$ substrate, and
   determining whether or not the LiTaO$_3$ substrate can be used as a surface acoustic wave device based on a result of said measurement.

8. The method for inspecting a lithium tantalate single crystal substrate as claimed in claim 7, wherein if the result of said measurement is such that the acoustic velocity of said shear vertical type elastic wave is not lower than 3140 m/s and not higher than 3200 m/s, then said LiTaO$_3$ substrate is determined to be usable as a surface acoustic wave device.

* * * * *